(12) United States Patent
Watanabe

(10) Patent No.: US 9,584,103 B2
(45) Date of Patent: Feb. 28, 2017

(54) SIGNAL POTENTIAL CONVERTER

(71) Applicant: SOCIONEXT INC., Kanagawa (JP)

(72) Inventor: Seiji Watanabe, Kyoto (JP)

(73) Assignee: SOCIONEXT INC., Kanagawa (JP)

( * ) Notice: Subject to any disclaimer, the term of this patent is extended or adjusted under 35 U.S.C. 154(b) by 0 days.

(21) Appl. No.: 15/191,455

(22) Filed: Jun. 23, 2016

(65) Prior Publication Data

US 2016/0308518 A1 Oct. 20, 2016

Related U.S. Application Data

(63) Continuation of application No. PCT/JP2014/006271, filed on Dec. 16, 2014.

(30) Foreign Application Priority Data

Dec. 25, 2013 (JP) ................................ 2013-267931

(51) Int. Cl.
*H03K 19/0185* (2006.01)
*H03K 5/08* (2006.01)
*H03K 19/0175* (2006.01)

(52) U.S. Cl.
CPC ............ *H03K 5/08* (2013.01); *H03K 19/0185* (2013.01); *H03K 19/017581* (2013.01); *H03K 19/018521* (2013.01)

(58) Field of Classification Search
CPC .............. H03K 5/08; H03K 19/017509; H03K 19/017581; H03K 19/0185; H03K 19/018507; H03K 19/018521
See application file for complete search history.

(56) References Cited

U.S. PATENT DOCUMENTS

| 6,285,209 | B1 | 9/2001 | Sawai | |
|---|---|---|---|---|
| 8,692,605 | B2* | 4/2014 | Jao | .................. H03K 5/2472 327/309 |
| 8,884,680 | B2* | 11/2014 | Iwata | ............. H03K 19/018521 327/333 |
| 9,450,583 | B2* | 9/2016 | Zhang | ............ H03K 19/018507 |
| 2014/0043084 | A1 | 2/2014 | Iwata | |
| 2016/0294372 | A1* | 10/2016 | Ebuchi | ................ H03K 19/0175 |

FOREIGN PATENT DOCUMENTS

| JP | 2000-091902 A | 3/2000 |
|---|---|---|
| JP | 2009-044304 A | 2/2009 |
| WO | 2012/157031 A1 | 11/2012 |

OTHER PUBLICATIONS

International Search Report issued in corresponding International Patent Application No. PCT/JP2014/006271, mailed on Mar. 10, 2015; with English translation.

* cited by examiner

*Primary Examiner* — Patrick O'Neill
(74) *Attorney, Agent, or Firm* — McDermott Will & Emery LLP

(57) ABSTRACT

In a signal potential converter, a capacitor receives an input signal CIN at one terminal thereof and has the other terminal thereof connected to a terminal node. A clamp circuit defines a potential (signal IN) at the terminal node within the range of a first potential to a second potential. The clamp circuit includes a level adjuster circuit configured to adjust at least one of the first and second potentials according to a supply voltage of a circuit that drives the input signal CIN.

5 Claims, 5 Drawing Sheets

SIGNAL POTENTIAL CONVERTER

CROSS-REFERENCE TO RELATED APPLICATION

This is a continuation of International Application No. PCT/JP2014/006271 filed on Dec. 16, 2014, which claims priority to Japanese Patent Application No. 2013-267931 filed on Dec. 25, 2013. The entire disclosures of these applications are hereby incorporated by reference.

BACKGROUND

The present disclosure relates to a signal potential converter for converting the potential of an input signal to pass a signal having a different potential.

As the feature size of transistors has been further reduced lately, their operating voltage has become lower and lower year after year. As for external interfaces, on the other hand, their operating voltage is rated in advance in accordance with a standard. Therefore, integrated circuits need to operate at an operating voltage of 5 V or 3.3 V, for example, so as to be connectible to existing devices as well. Thus, a level shifter (signal potential converter) is used to arbitrate between a signal to be driven by a micro-transistor and a signal to be driven at, e.g., 5 V or 3.3 V. To transmit a signal at high speeds, in particular, an AC coupler using a capacitor may be used effectively.

PCT International Application Publication No. 2012/157031 discloses a configuration for reducing a variation in potential at a terminal node of a signal potential converter so as to prevent jitter from being produced in the converted signal.

According to the configuration of PCT International Application Publication No. 2012/157031, an upper limit potential and a lower limit potential are set with respect to a signal at an AC coupled terminal node such that the signal is clamped. In such a configuration, if the clamp potential difference does not agree with the amplitude of the signal, then jitter tends to be produced in the converted signal.

For example, if the amplitude of the signal is smaller than the clamp potential difference (VCLT−VCLB) as shown in FIG. 6A, then the signal level is not stabilized. On the other hand, if the amplitude of the signal is larger than the clamp potential difference (VCLT−VCLB) as shown in FIG. 6B, then the waveform of the signal will have distortion. In either case, such a phenomenon produces jitter in the converted signal.

Such a problem may be overcome by adjusting the clamp potential difference to the amplitude of the signal. However, the amplitude of the signal is affected by the supply voltage of a circuit section generating an input signal. Thus, a configuration for dynamically adjusting the clamp potential according to the supply voltage on an input end is required.

Thus, the present disclosure provides a signal potential converter configured to adjust dynamically a clamp potential according to a supply voltage on an input end.

SUMMARY

A signal potential converter according to an aspect of the present disclosure includes: a capacitor, one terminal of which receives an input signal and the other terminal of which is connected to a terminal node; and a clamp circuit configured to receive a potential at the terminal node. The clamp circuit includes: a first connection element provided between a first power supply and the terminal node; and a second connection element provided between the terminal node and a second power supply having a lower supply voltage than the first power supply. The impedance of the first connection element decreases when the potential at the terminal node becomes lower than a first potential that is higher than the supply voltage of the second power supply. The impedance of the second connection element decreases when the potential at the terminal node becomes higher than a second potential that is lower than the supply voltage of the first power supply and higher than the first potential. The clamp circuit includes a level adjuster circuit configured to adjust at least one of the first and second potentials according to the supply voltage of a circuit that drives the input signal.

According to this aspect, the potential at the terminal node is defined by the clamp circuit to fall within the range of a first potential to a second potential. Also, at least one of the first and second potentials is adjusted by the level adjuster circuit according to the supply voltage of a circuit that drives the input signal. Thus, even if the supply voltage of the circuit that drives the input signal has varied to cause a variation in the amplitude of the input signal, the clamp potential may be adjusted dynamically according to the variation. Consequently, this may reduce the jitter to be produced in the converted signal.

The present disclosure provides a signal potential converter configured to adjust dynamically a clamp potential according to a supply voltage on an input end.

DETAILED DESCRIPTION

In the following description of embodiments, a power supply and its supply voltage will be identified by the same reference sign unless there is any problem, in particular.

First Embodiment

Figure 1:
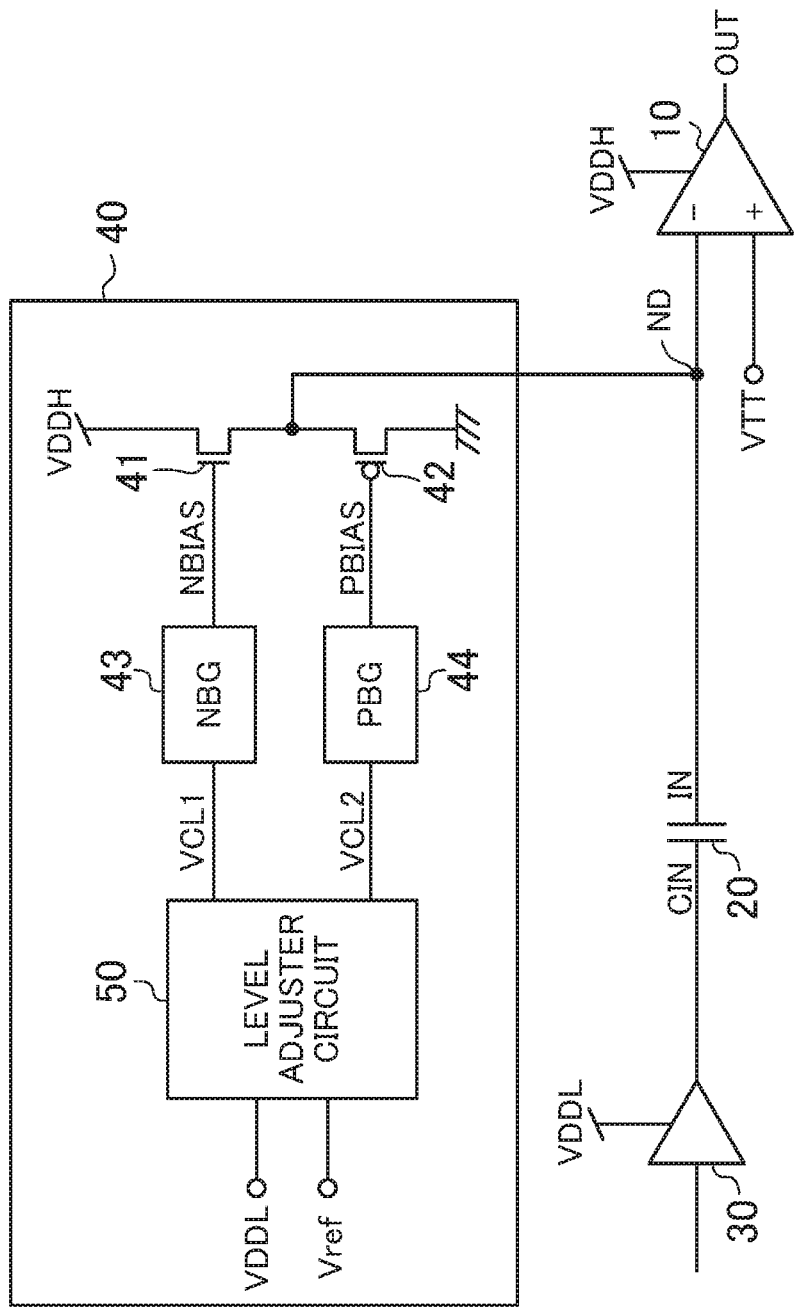
FIG. 1 illustrates a configuration for a signal potential converter according to a first embodiment.

FIG. 1 illustrates a circuit configuration for a signal potential converter according to a first embodiment and other circuits preceding and following the signal potential converter. The signal potential converter shown in FIG. 1 utilizes AC coupling. As shown in FIG. 1, a receiver circuit 10 receives a signal IN at a terminal node ND and generates an output signal OUT. A capacitor 20 receives an input signal CIN at one terminal thereof and has the other terminal thereof connected to the terminal node ND. A signal driver circuit 30 drives the input signal CIN. A clamp circuit 40 receives the potential at the terminal node ND (i.e., the signal IN). The signal potential converter of this embodiment includes the capacitor 20 and the clamp circuit 40.

The signal driver circuit 30 is supplied with a supply voltage VDDL, and outputs a signal CIN, of which the amplitude is VDDL. The receiver circuit 10 is supplied with a supply voltage VDDH, amplifies the potential of the signal IN with respect to a reference potential VTT, and generates an output signal OUT, of which the amplitude is VDDH. To allow the receiver circuit 10 to operate normally, the signal IN needs to have amplitude centered around the reference potential VTT.

The clamp circuit 40 has the function of changing the signal potential such that the signal IN has such amplitude centered around the reference potential VTT. That is to say, the clamp circuit 40 raises the potential of the signal IN if the signal IN becomes lower than a clamp potential VCL1 serving as a first potential, and lowers the potential of the signal IN if the signal IN becomes higher than a clamp potential VCL2 serving as a second potential. Note that ground potential<VCL1<VCL2<VDDH is satisfied. Thus, the signal IN is allowed to change its potential level with reliability within the range of the potential VCL1 to the potential VCL2. As a result, the input signal CIN may have its level converted with reliability without changing its data width.

Specifically, the clamp circuit 40 includes an NMOS transistor 41 having its drain and source connected to a power supply VDDH functioning as a first power supply and the terminal node ND, respectively, and a PMOS transistor 42 having its drain and source connected to a ground power supply functioning as a second power supply and the terminal node ND, respectively. That is to say, the NMOS transistor 41 functioning as a first connection element and the PMOS transistor 42 functioning as a second connection element terminate the input node of the receiver circuit 10.

The clamp circuit 40 further includes: a control potential generator circuit 43 (identified by NBG in FIG. 1) for generating a gate potential NBIAS for the NMOS transistor 41; another control potential generator circuit 44 (identified by PBG in FIG. 1) for generating a gate potential PBIAS for the PMOS transistor 42; and a level adjuster circuit 50 for adjusting the respective levels of the potentials VCL1 and VCL2. The control potential generator circuit 43 receives an output potential VCL1 of the level adjuster circuit 50, and controls the gate potential NBIAS so as to make the NMOS transistor 41 electrically conductive when the potential at the terminal node ND becomes lower than the potential VCL1. The control potential generator circuit 44 receives an output potential VCL2 of the level adjuster circuit 50, and controls the gate potential PBIAS so as to make the PMOS transistor 42 electrically conductive when the potential at the terminal node ND becomes higher than the potential VCL2.

The level adjuster circuit 50 adjusts the potentials VCL1 and VCL2 according to the level of the supply voltage VDDL of the signal driver circuit 30 that drives the input signal CIN. The level adjuster circuit 50 receives the supply voltage VDDL and a predetermined reference potential Vref.

Figure 2:
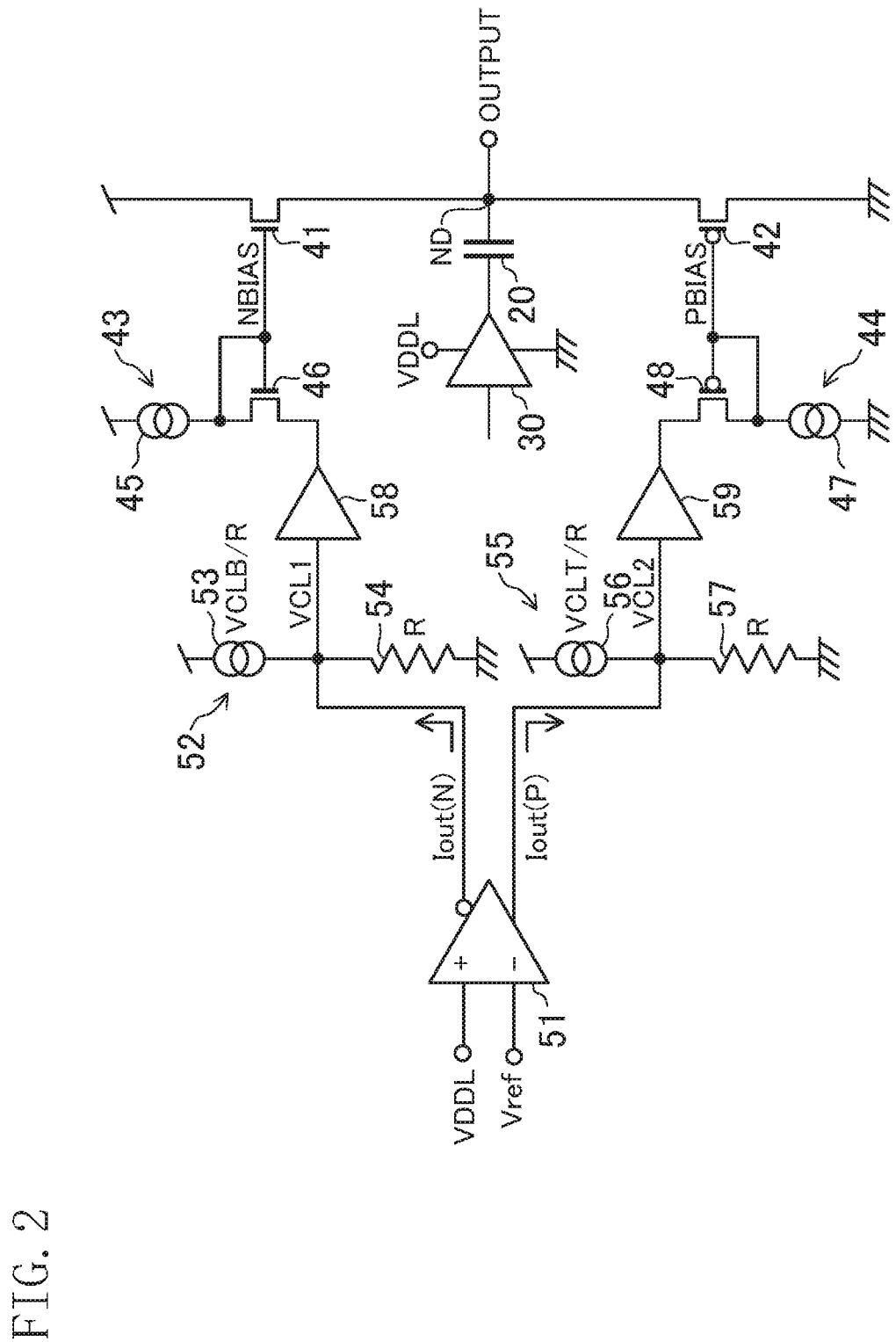
FIG. 2 illustrates an exemplary configuration for the clamp circuit shown in FIG. 1.

FIG. 2 illustrates an exemplary configuration for the clamp circuit 40. According to the configuration shown in FIG. 2, the control potential generator circuit 43 is comprised of a current source 45 and an NMOS transistor 46, and the control potential generator circuit 44 is comprised of a current source 47 and a PMOS transistor 48. The level adjuster circuit 50 includes a comparator 51, two current sources 53, 56, and two resistors 54, 57. The current source 53 and the resistor 54 form a subtractor 52. The current source 56 and the resistor 57 form an adder 55. The output potential VCL1 of the subtractor 52 is supplied to the control potential generator circuit 43 via a buffer 58. The output potential VCL2 of the adder 55 is supplied to the control potential generator circuit 44 via another buffer 59.

Each of these buffers 58 and 59 outputs an analog input voltage at low impedance. The buffer 58 reduces occurrence of an error in the potential VCL1 by preventing a current from flowing from the control potential generator circuit 43 into the subtractor 52. The buffer 59 reduces occurrence of an error in the potential VCL2 by preventing a current from flowing out from the adder 55 into the control potential generator circuit 44. Alternatively, instead of inserting the buffer 58, it is possible to insert a current source allowing the same amount of current as the current supplied from the current source 45 to flow from an output node of the subtractor 52 in the ground direction. Also, instead of inserting the buffer 59, it is possible to insert a current source allowing the same amount of current as the current supplied from the current source 44 to flow from the power supply to an output node of the adder 55.

The comparator 51 receives the supply voltage VDDL and the reference potential Vref. Then, the comparator 51 converts the potential difference between the supply voltage VDDL and the reference voltage Vref, i.e., ΔVDDL (=VDDL−Vref), into a current using a built-in resistor, and then outputs the resultant current. Supposing the resistance value of the built-in resistor is Rin, the two current outputs Iout(N) and Iout(P) of the comparator 51 are respectively calculated by:

$$Iout(N) = -\Delta VDDL/Rin$$

$$Iout(P) = \Delta VDDL/Rin$$

In the subtractor 52, the current source 53 converts a base potential VCLB for the potential VCL1 into a current. An output current of the current source 53 and the current output Iout(N) of the comparator 51 flow through the resistor 54. As a result, the potential VCL1 is obtained. Supposing the current value of the current source 53 is VCLB/R and the resistance value of the resistor 54 is R, $$VCL1 = R \times (VCLB/R + Iout(N))$$
$$= VCLB - \Delta VDDL \times (R/Rin)$$

is satisfied. Meanwhile, in the adder 55, the current source 56 converts a base potential VCLT for the potential VCL2 into a current. An output current of the current source 56 and the current output Iout(P) of the comparator 51 flow through the resistor 57. As a result, the potential VCL2 is obtained. Supposing the current value of the current source 56 is VCLT/R and the resistance value of the resistor 57 is R, $$VCL2 = R \times (VCLT/R + Iout(P))$$
$$= VCLT + \Delta VDDL \times (R/Rin)$$

is satisfied.

Figure 3:
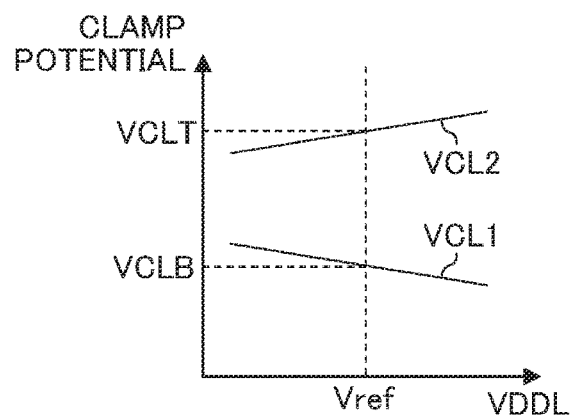
FIG. 3 is graph showing how the clamp potential changes in an embodiment with a supply voltage on the input end.

FIG. 3 is a graph showing how the clamp potential changes as the supply voltage VDDL varies. As shown in FIG. 3, when the supply voltage VDDL is equal to the reference potential Vref, the clamp potentials VCL1 and VCL2 are equal to their base potentials VCLB and VCLT, respectively. As the supply voltage VDDL falls, the clamp potential VCL1 rises and the clamp potential VCL2 falls. That is to say, as the amplitude of the input signal CIN decreases with the fall in the supply voltage VDDL, the potential difference between the clamp potentials VCL1 and VCL2 decreases so as to follow up the decrease in the amplitude. On the other hand, as the supply voltage VDDL rises, the clamp potential VCL1 falls and the clamp potential VCL2 rises. That is to say, as the amplitude of the input signal CIN increases with the rise in the supply voltage VDDL, the potential difference between the clamp potentials VCL1 and VCL2 increases so as to follow up the increase in the amplitude. Note that the degree of follow-up of the clamp potentials VCL1 and VCL2 may be adjusted by the resistance value Rin of the built-in resistor of the comparator 51, for example As can be seen from the foregoing description, according to this embodiment, the potential at the terminal node ND is defined by the clamp circuit 40 within the range of the potential VCL1 to the potential VCL2. Also, the potentials VCL1 and VCL2 are adjusted by the level adjuster circuit 50 according to the supply voltage VDDL of the circuit 30 that drives the input signal CIN. Thus, even if the supply voltage VDDL of the circuit 30 that drives the input signal CIN varies so much as to cause a variation in the amplitude of the input signal CIN, the clamp potentials VCL1 and VCL2 may still be dynamically adjusted accordingly. Consequently, this may reduce a jitter to be produced in the converted signal OUT.

Figure 4:
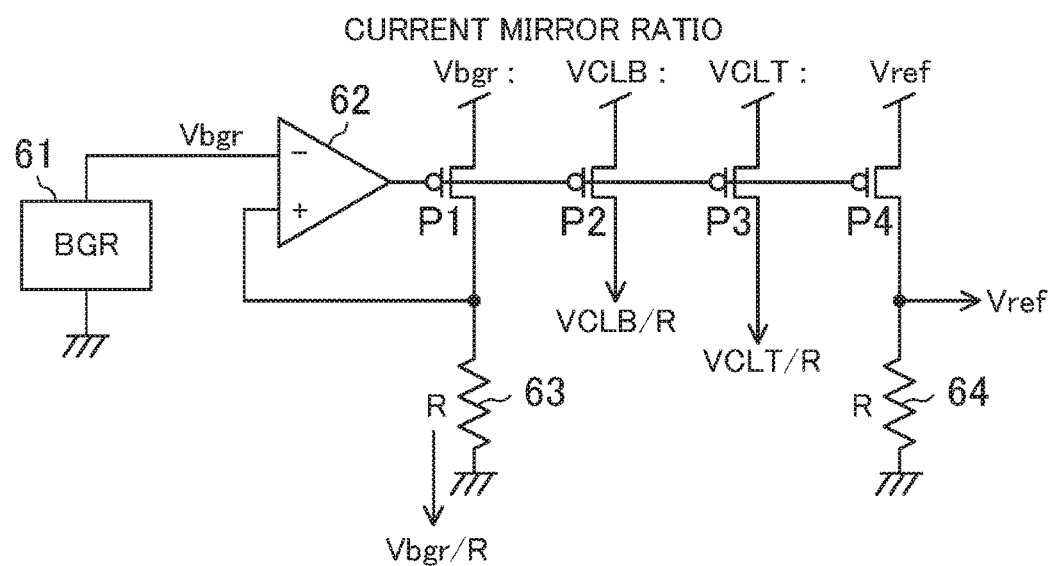
FIG. 4 illustrates an exemplary configuration for generating a current and a reference voltage in FIG. 2.

Note that in the level adjuster circuit 50 of this embodiment, the current values of the current sources 53, 56 and the reference potential Vref may be determined by a circuit configuration such as the one shown in FIG. 4, for example In FIG. 4, a bandgap reference circuit 61 (identified by "BGR" in FIG. 4) generates and outputs a base voltage Vbgr. A feedback loop formed by an operational amplifier 62, a transistor P1, and a resistor 63 generates a base current with a current value Vbgr/R based on the base voltage Vbgr.

Since the current mirror ratio between the transistors P2 and P1 is Vgbr: VCLB, the current value of the current to flow through the transistor P2 is calculated by VCLB/R (=(Vgbr/R)×(VCLB/Vbgr)). That is to say, the current source 53 may be implemented. Also, since the current mirror ratio between the transistors P3 and P1 is Vgbr: VCLT, the current value of the current to flow through the transistor P3 is calculated by VCLT/R (=(Vbgr/R)×(VCLT/Vbgr)). That is to say, the current source 56 may be implemented.

Furthermore, since the current mirror ratio between the transistors P4 and P1 is Vgbr: Vref, the current value of the current to flow through the transistor P4 is calculated by Vref/R (=(Vbgr/R)×(Vref/Vgbr)). The reference potential Vref is generated by allowing this current to flow through the resistor 64 (with a resistance value R). Optionally, the current mirror ratio may also be set to be 1:1, and the resistance value of the resistor 64 may also be R×(Vref/Vbgr).

In the embodiment described above, the terminal node ND is supposed to be terminated using the NMOS and PMOS transistors 41 and 42. However, this is only a non-limiting exemplary embodiment. Alternatively, as long as its impedance decreases when the potential at the terminal node ND becomes lower than VCL1, any other connection element may replace the NMOS transistor 41. Also, as long as its impedance decreases when the potential at the terminal node ND becomes higher than VCL2, any other connection element may replace the PMOS transistor 42.

Second Embodiment

In the first embodiment described above, the signals are supposed to be single-ended signals. However, the present disclosure is also applicable to a configuration for converting the level of a differential signal pair.

Figure 5:
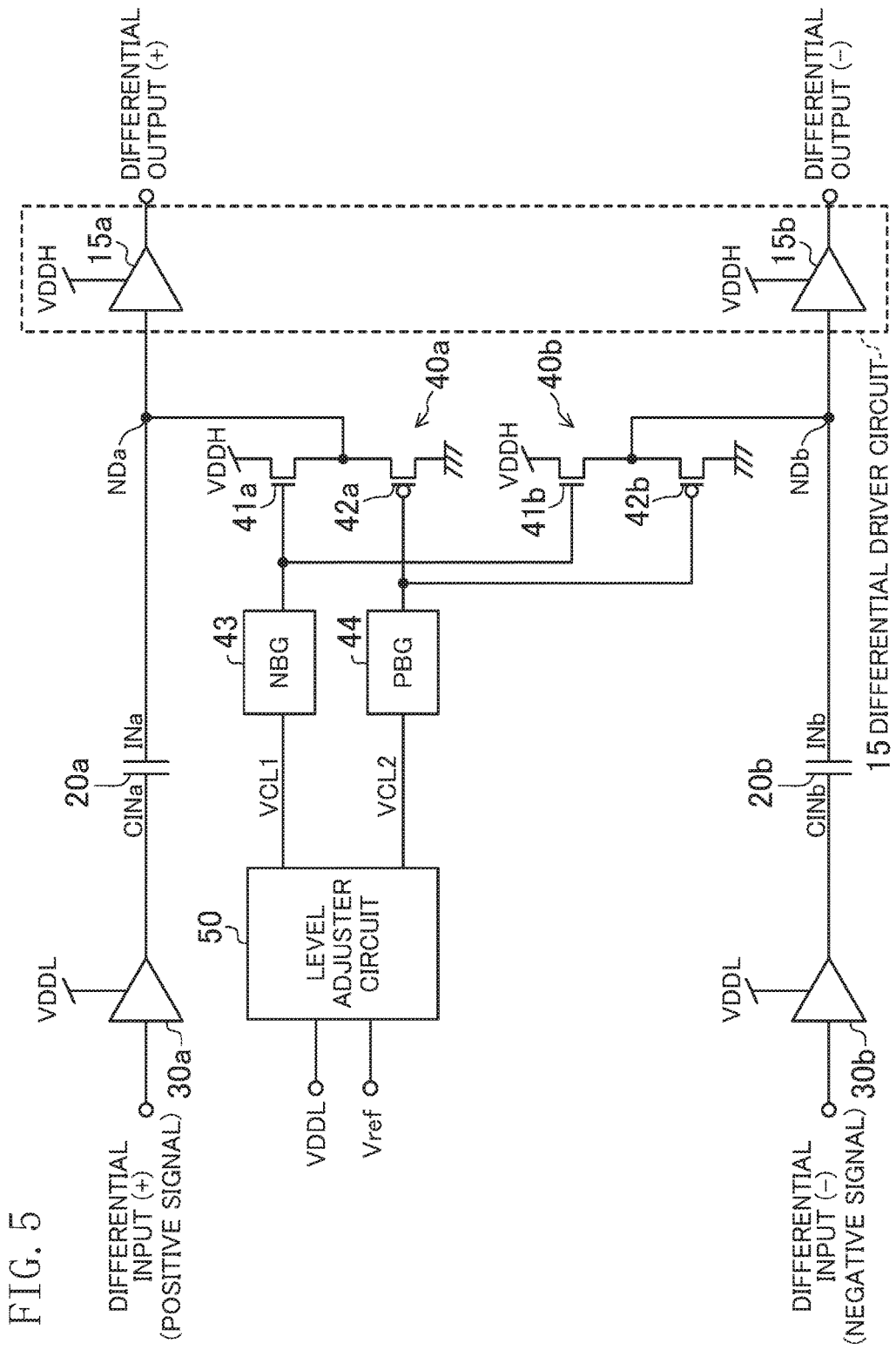
FIG. 5 illustrates a configuration for a signal potential converter according to a second embodiment.
Figure 6A:
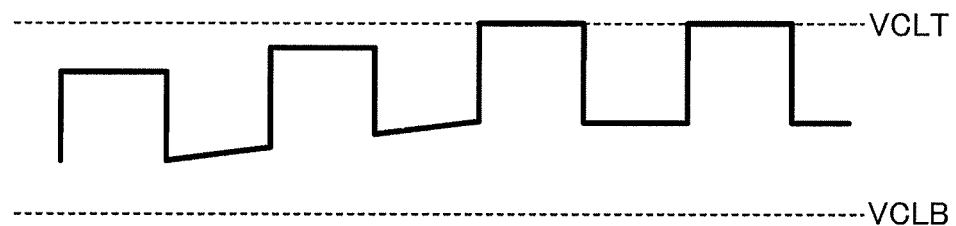
FIGS. 6A and 6B show waveforms of signals to point out problems.
Figure 6B:
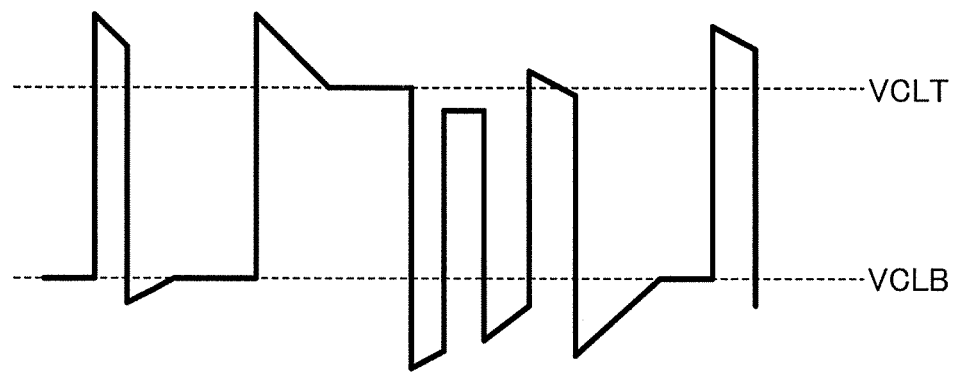

FIG. 5 illustrates a circuit configuration for a signal potential converter according to a second embodiment and circuits preceding and following the converter. In the configuration shown in FIG. 5, a receiver circuit 15a, 15b, a capacitor 20a, 20b, a signal driver circuit 30a, 30b, and a clamp circuit 40a, 40b are provided for each of positive and negative signals that form a differential signal pair. A differential driver circuit 15 is formed by the receiver circuits 15a and 15b. A signal potential converter according to this embodiment includes the capacitors 20a and 20b and the clamp circuits 40a and 40b.

Each of the signal driver circuits 30a, 30b is supplied with a supply voltage VDDL and outputs a signal CINa, CINb, of which the amplitude is VDDL. The differential driver circuit 15 is supplied with a supply voltage VDDH and amplifies the potential of the signal INa, INb, thereby generating a differential signal, of which the amplitude is VDDH.

The clamp circuit 40a raises the potential of the signal INa if the signal INa becomes lower than a potential VCL1, and lowers the potential of the signal INa if the signal INa becomes higher than a potential VCL2. Likewise, the clamp circuit 40b raises the potential of the signal INb if the signal INb becomes lower than the potential VCL1, and lowers the potential of the signal INb if the signal INb becomes higher than the potential VCL2.

Specifically, the clamp circuit 40a includes: an NMOS transistor 41a functioning as a first connection element, of which the drain is connected to the power supply VDDH functioning as a first power supply, and of which the source is connected to a terminal node NDa; and a PMOS transistor 42a functioning as a second connection element, of which the drain is connected to a ground power supply functioning as a second power supply, and of which the source is connected to the terminal node NDa. On the other hand, the clamp circuit 40b includes: an NMOS transistor 41b functioning as a first connection element, of which the drain is connected to the power supply VDDH functioning as the first power supply, and of which the source is connected to a terminal node NDb; and a PMOS transistor 42b functioning as a second connection element, of which the drain is connected to the ground power supply functioning as the second power supply, and of which the source is connected to the terminal node NDb. The clamp circuits 40a, 40b share a control potential generator circuit 43 that generates a gate potential for the NMOS transistors 41a, 41b and a control potential generator circuit 44 that generates a gate potential for the PMOS transistors 42a, 42b.

The clamp circuits 40a, 40b further share a level adjuster circuit 50 that adjusts the respective levels of the potentials VCL1, VCL2. The control potential generator circuit 43 receives the output potential VCL1 of the level adjuster circuit 50, and controls the gate potential such that the NMOS transistor 41a, 41b becomes conductive when the potential at the terminal node NDa, NDb becomes lower than the potential VCL1. The control potential generator circuit 44 receives the output potential VCL2 of the level adjuster circuit 50, and controls the gate potential such that the PMOS transistor 42a, 42b becomes conductive when the potential at the terminal node NDa, NDb becomes higher than the potential VCL2. The level adjuster circuit 50 adjusts the potential VCL1, VCL2 according to the level of the supply potential VDDL for the signal driver circuit 30a, 30b that drives the input signal CINa, CINb. The level adjuster circuit 50 receives the supply potential VDD and a predetermined reference potential Vref. Specific configuration and operation of the level adjuster circuit 50 are the same as what has already been described for the first embodiment, and description thereof will be omitted herein.

According to this embodiment, the same effects and advantages as the ones achieved by the first embodiment are also achieved. Specifically, the potential at the terminal node NDa, NDb is defined by the clamp circuit 40a, 40b within the range of the potential VCL1 to the potential VCL2. Also, the potentials VCL1 and VCL2 are adjusted by the level adjuster circuit 50 according to the supply voltage VDDL of the circuit 30a, 30b that drives the input signal CINa, CINb. Thus, even if the supply voltage VDDL of the circuit 30a, 30b that drives the input signal CINa, CINb varies so much as to cause a variation in the amplitude of the input signal CINa, CINb, the clamp potentials VCL1 and VCL2 may be dynamically adjusted accordingly. Consequently, this may reduce a jitter to be produced in the converted differential output.

Optionally, the control potential generator circuits 43, 44 and the level adjuster circuit 50 may be provided for each of the clamp circuits 40a, 40b. However, the overall circuit size is reducible advantageously by sharing these circuits 43, 44 and 50 as in FIG. 5.

In the embodiment described above, the terminal node NDa, NDb is supposed to be terminated using the NMOS transistor 41a, 41b and the PMOS transistor 42a, 42b. However, this is only a non-limiting exemplary embodiment. That is to say, any other connection element may replace the NMOS transistor 41a, 41b as long as its impedance decreases when the potential at the terminal node NDa, NDb becomes lower than VCL1. Likewise, any other connection element may replace the PMOS transistor 42a, 42b as long as its impedance decreases when the potential at the terminal node NDa, NDb becomes higher than VCL2.

In the first and second embodiments described above, the level adjuster circuit 50 is supposed to adjust both of the clamp potentials VCL1 and VCL2 according to the supply voltage VDDL. However, the level adjuster circuit 50 may also adjust only one of the clamp potentials VCL1 and VCL2 according to the supply voltage VDDL while fixing the other at a constant value.

A signal potential converter according to the present disclosure may adjust a clamp potential dynamically according to a supply voltage on an input end, and therefore, may be used effectively in a high-speed interface circuit, for example.

What is claimed is:

1. A signal potential converter comprising:
a capacitor, one terminal of which receives an input signal and the other terminal of which is connected to a terminal node; and
a clamp circuit configured to receive a potential at the terminal node, wherein
the clamp circuit includes:
a first connection element provided between a first power supply and the terminal node; and
a second connection element provided between the terminal node and a second power supply having a lower supply voltage than the first power supply, the impedance of the first connection element decreases when the potential at the terminal node becomes lower than a first potential that is higher than the supply voltage of the second power supply,
the impedance of the second connection element decreases when the potential at the terminal node becomes higher than a second potential that is lower than the supply voltage of the first power supply and higher than the first potential, and
the clamp circuit includes a level adjuster circuit configured to adjust at least one of the first and second potentials according to the supply voltage of a circuit that drives the input signal.

2. The signal potential converter of claim 1, wherein the level adjuster circuit includes:
a comparator configured to convert a potential difference between the supply voltage of the circuit that drives the input signal and a predetermined reference potential into a first current and output the first current; and
a subtractor configured to convert a base potential for the first potential into a second current, subtract the first current from the second current, and convert the remainder of the second current into a voltage and output the voltage, and
the output voltage of the subtractor is used as the first potential.

3. The signal potential converter of claim 2, wherein the first connection element is an NMOS transistor, of which drain and source are connected to the first power supply and the terminal node, respectively, and
the converter further comprises a control potential generator circuit configured to generate, based on the output voltage of the subtractor, a control potential to be applied to a gate of the NMOS transistor.

4. The signal potential converter of claim 1, wherein the level adjuster includes:
a comparator configured to convert a potential difference between the supply voltage of the circuit that drives the input signal and a predetermined reference potential into a first current and output the first current; and
an adder configured to convert a base potential for the second potential into a second current, add the first current to the second current, and convert the sum of the first and second currents into a voltage and output the voltage, and
the output voltage of the adder is used as the second potential.

5. The signal potential converter of claim 4, wherein the second connection element is a PMOS transistor, of which drain and source are connected to the second power supply and the terminal node, respectively, and
the converter further comprises a control potential generator circuit configured to generate, based on the output voltage of the adder, a control potential to be applied to a gate of the PMOS transistor.

* * * * *